United States Patent
John et al.

(10) Patent No.: US 6,461,925 B1
(45) Date of Patent: Oct. 8, 2002

(54) METHOD OF MANUFACTURING A HETEROJUNCTION BICMOS INTEGRATED CIRCUIT

(75) Inventors: Jay P. John, Chandler, AZ (US); James A. Kirchgessner, Tempe, AZ (US); Ik-Sung Lim, Gilbert, AZ (US); Michael H. Kaneshiro, Phoenix, AZ (US); Vida Ilderem Burger, Phoenix, AZ (US); Phillip W. Dahl, Gilbert, AZ (US); David L. Stolfa, Moab, UT (US); Richard W. Mauntel, Phoenix; John W. Steele, Chandler, both of AZ (US)

(73) Assignee: Motorola, Inc., Schaumburg, IL (US)

( * ) Notice: Subject to any disclaimer, the term of this patent is extended or adjusted under 35 U.S.C. 154(b) by 0 days.

(21) Appl. No.: 09/539,130

(22) Filed: Mar. 30, 2000

(51) Int. Cl.[7] .............................................. H01L 21/331
(52) U.S. Cl. ........................ 438/309; 438/312; 438/285
(58) Field of Search ................................ 438/309, 312, 438/313, 320, 285

(56) References Cited

U.S. PATENT DOCUMENTS 5,512,772 A * 4/1996 Maeda et al.
6,043,552 A * 3/2000 Miwa

OTHER PUBLICATIONS

K. E. Ehwald, et al. "Modular Integration of High Performance SiGe:C HBT's . . . " 1999 IEEE 0–7803–5413–3/99.*
S.A. St.Onge, et al. "A 0.24 um SiGe BiCMOS . . . " 1999 IEEE 0–7803–5712–4/99.*

Jeng, "Impact of Extrinsic Base Process on NPN HBT Performance and Polysilicon Resistor in Integrated SiGe HBTs," IEEE, pp. 187–190 (1997).

Modular Integration of High–Performance SiGe:C HBTs in a Deep Submicron, Epi–Free CMOS Process, 0–7803–5413–3/99 1999 IEEE, K.E. Ehwald, et al.

A 0.24 μm SiGe BiCMOS Mixed–Signal RF Production Technology Featuring a 47 GHz $f_t$ HBT and 0.18 μm $L_{eff}$ CMOS, 0–7803–5712–4/99 1999 IEEE, S.A. St.Onge, et al.

* cited by examiner

Primary Examiner—Caridad Everhart

(57) ABSTRACT

A method of manufacturing a heterojunction BiCMOS IC. (100) includes forming a gate electrode (121, 131), forming a protective layer (901, 902) over the gate electrode, forming a semiconductor layer (1101) over the protective layer, depositing an electrically insulative layer (1102, 1103) over the semiconductor layer, using a mask layer (1104) to define a doped region (225) in the semiconductor layer and to define a hole (1201) in the electrically insulative layer, forming an electrically conductive layer (1301) over the electrically insulative layer, using another mask layer (1302) to define an emitter region (240) in the electrically conductive layer and to define an intrinsic base region (231) and a portion of an extrinsic base region (232) in the electrically conductive layer, and using yet another mask layer (1502) to define another portion of the extrinsic base region in the electrically conductive layer.

28 Claims, 7 Drawing Sheets

US 6,461,925 B1

METHOD OF MANUFACTURING A HETEROJUNCTION BICMOS INTEGRATED CIRCUIT

RELATED APPLICATION

Related subject matter is disclosed in United States patent application Ser. No. 09/538,884 filed on Mar. 30, 2000 and assigned to the same assignee.

FIELD OF THE INVENTION

This invention relates, in general, to integrated circuits (ICs), and more particularly, to methods of manufacturing ICs having bipolar transistors.

BACKGROUND OF THE INVENTION

Bipolar Complimentary Metal-Oxide-Semiconductor (BiCMOS) ICs are used in a wide range of applications. Most of these BiCMOS ICs use homojunction bipolar transistors with limited electrical performance characteristics. Using band gap engineering, researchers have developed heterojunction bipolar transistors (HBTs) with electrical performance characteristics that are superior to those of homojunction bipolar transistors. However, the integration of these HBTs with conventional CMOS manufacturing processes is complicated. Accordingly, a need exists for a method of manufacturing heterojuniction BiCMOS ICs where the manufacturing steps specific to the HBT are modular and compatible with a wide range of conventional CMOS manufacturing processes.

BRIEF DESCRIPTION OF THE DRAWINGS

The invention will be better understood from a reading of the following detailed description, taken in conjunction with the accompanying drawing figures in which.

Figure 1:
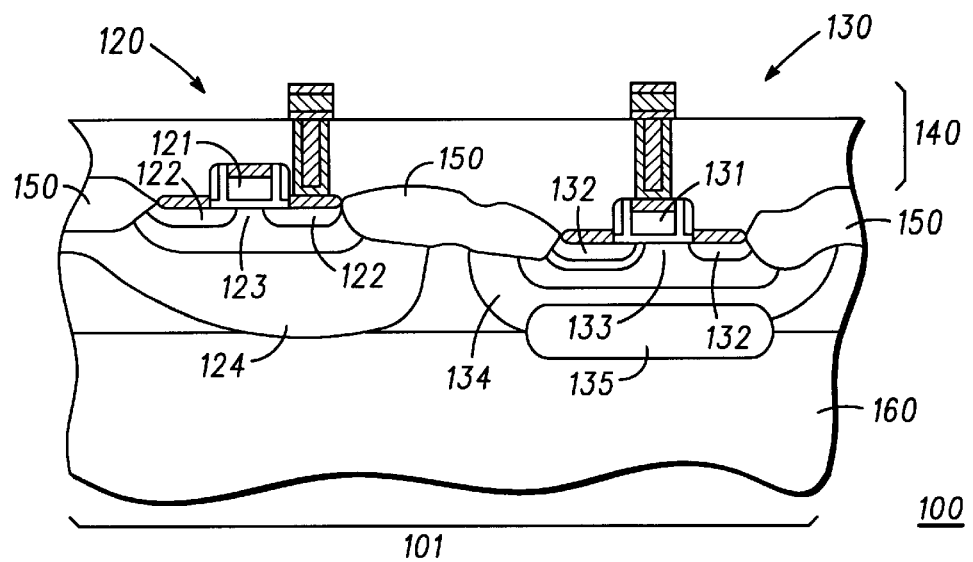
FIG. 1 illustrates a cross-sectional view of a CMOS portion of a heterojunction BiCMOS IC in accordance with an embodiment of the invention.

For simplicity and clarity of illustration, the drawing figures illustrate the general manner of construction, and elements in the drawing figures are not necessarily drawn to scale. Additionally, the same reference numerals in different figures denote the same elements. Moreover, descriptions and details of well-known features and techniques such as, for example, pre-deposition cleans and post-etch cleans are omitted to avoid unnecessarily obscuring the invention. Furthermore, the terms top, bottom, over, under, and the like in the description and in the claims, if any, are used for descriptive purposes, and the terms so used are for the purposes of describing relative positions and are interchangeable under appropriate circumstances.

DETAILED DESCRIPTION OF THE DRAWINGS

FIG. 1 illustrates a cross-sectional view of a CMOS portion 101 of a heterojunction BiCMOS IC 100. Portion 101 comprises an N-channel MOS (N-MOS) transistor 120 and a P-channel MOS (P-MOS) transistor 130. N-MOS transistor 120 comprises, among other features, an N-type gate electrode 121, N-type source and drain regions 122, a channel region 123, and a P-type well 124. P-MOS transistor 130 comprises, among other features, a P-type gate electrode 131, P-type source and drain regions 132, a channel region 133, and an N-type well 134. P-MOS transistor 130 can also have a heavily doped N-type region 135 located underneath N-type well 134. The N-type conductivity represents a first conductivity type, and the P-type conductivity represents a second conductivity type. One skilled in the art will understand that heterojunction BiCMOS IC 100 comprises a plurality of transistors similar to transistors 120 and 130.

Heterojunction BiCMOS IC 100 also comprises a multi-level interconnect structure 140 located over and electrically coupled to transistors 120 and 130. For simplicity, FIG. 1 illustrates merely a first level of multi-level interconnect structure 140. Heterojunction BiCMOS IC 100 further comprises, among many other features, a semiconductor substrate 160 and a plurality of field oxide regions or electrically insulative regions 150.

Figure 2:
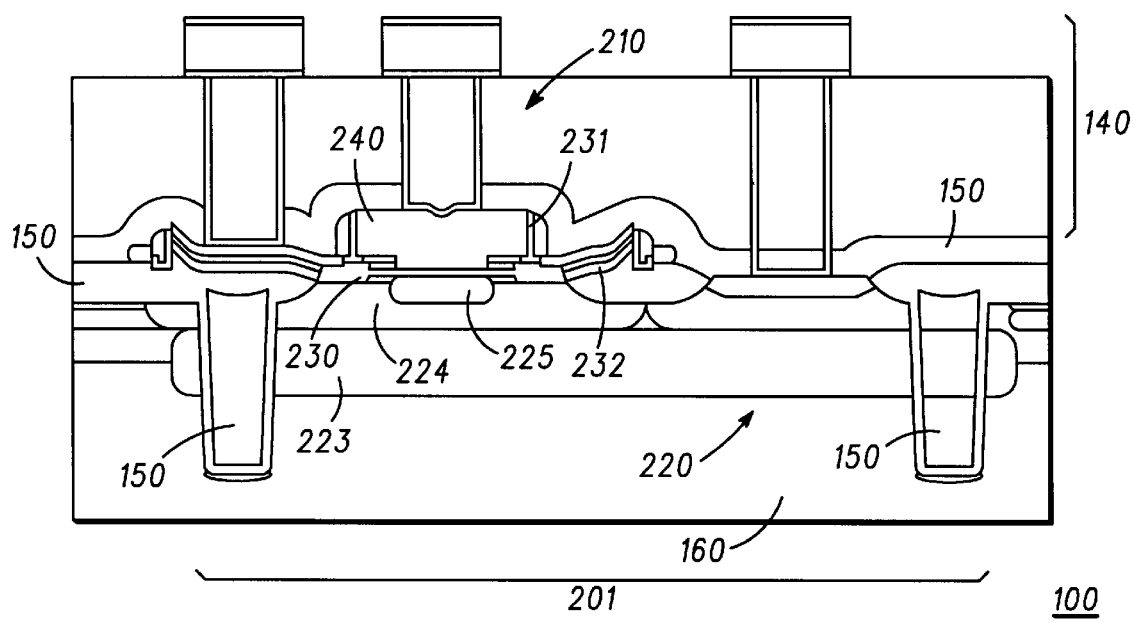
FIG. 2 illustrates a cross-sectional view of an HBT portion of the heterojunction BiCMOS IC in accordance with an embodiment of the invention.

FIG. 2 illustrates a cross-sectional view of an HBT portion 201 of heterojunction BiCMOS IC 100. Portion 201 comprises an HBT 210. HBT 210 comprises a collector region 220, a base region 230, and an emitter region 240. Collector region 220 comprises a plurality of regions 221, 222, 223, 224, and 225. Base region 230 comprises an intrinsic base region 231 and an extrinsic base region 232. In the preferred embodiment, HBT 210 is an NPN transistor such that collector region 220 and emitter region 240 have an N-type conductivity and such that base region 230 has a P-type conductivity. One skilled in the art will understand that heterojunction BiCMOS IC 100 comprises a plurality of transistors similar to HBT 210.

Figure 3:
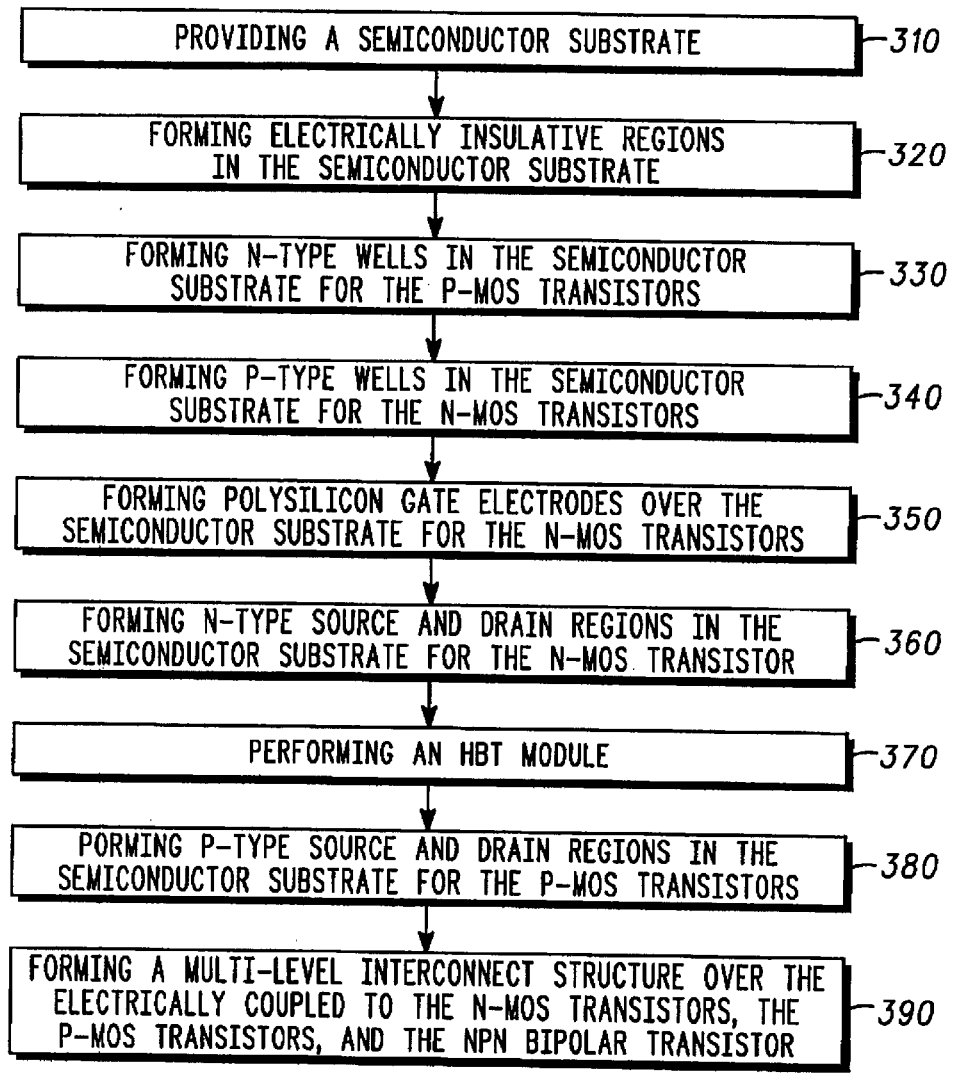
FIG. 3 illustrates a flow chart of a method of manufacturing the heterojunction BiCMOS IC in accordance with an embodiment of the invention.

FIG. 3 illustrates a flow chart 300 of a method of manufacturing heterojunction BiCMOS IC 100 (FIGS. 1 and 2). At a step 310 in flow chart 300, a semiconductor substrate is provided. In the preferred embodiment, the semiconductor substrate has an epitaxial layer and a support substrate located under and supporting the epitaxial layer. Also in the preferred embodiment, the support substrate and the epitaxial layer have a P-type conductivity and are each comprised of the same semiconductor material such as, for example, silicon. As an example, the semiconductor substrate of step 310 can be similar to substrate 160 in FIGS. 1 and 2.

A buried layer for the bipolar transistor is formed in the epitaxial layer of the semiconductor substrate. The buried layer can be formed before or after the formation of the epitaxial layer over the support substrate. The buried layer is used for a buried collector region in the HBT and is preferably heavily doped with an N-type dopant. As an example, the buried collector region can be similar to region 223 (FIG. 2) in HBT 210 (FIG. 2). Region 135 (FIG. 1) in P-MOS transistor 130 (FIG. 1) may optionally be formed simultaneously with region 223 (FIG. 2).

Next, at a step 320 in flow chart 300, electrically insulative regions are formed in the epitaxial layer of the semiconductor substrate. These electrically insulative regions can include field oxide regions formed by processes such as, for example, LOCalized Oxidation of Silicon (LOCOS), polysilicon-buffered LOCOS, Polysilicon Encapsulated Localized OXidation (PELOX), or shallow trench isolation. Furthermore, the electrically insulative regions can include deep trench isolation in addition to the field oxide regions. As an example, the electrically insulative regions formed during step 320 can be similar to electrically insulative regions 150 (FIGS. 1 and 2).

Subsequently, at a step 330 in flow chart 300, N-type wells are formed in the epitaxial layer of the semiconductor substrate, and at a step 340 in flow chart 300, P-type wells are formed in the epitaxial layer of the semiconductor substrate. The N-type and P-type wells can be formed by implantation and/or diffusion processes. As an example, the N-type wells of step 330 can be similar to N-type well 134 (FIG. 1) in P-MOS transistor 130 (FIG. 1), and the P-type wells of step 340 can be similar to P-type well 124 (FIG. 1) in N-MOS transistor 120 (FIG. 1). Furthermore, region 222 (FIG. 2) in collector region 220 (FIG. 2) for HBT 210 (FIG. 2) can be simultaneously formed with N-type well 134 (FIG. 1) during step 330. One skilled in the art will understand that the sequence of steps 330 and 340 can be reversed.

Then, at a step 350 in flow chart 300, gate electrodes can be formed over the epitaxial layer of the semiconductor substrate. In the preferred embodiment, the gate electrodes are comprised of as-deposited amorphous silicon, which is subsequently annealed into polycrystalline silicon (polysilicon). For example, the gate electrodes can be formed by depositing a layer of undoped amorphous silicon, patterning or etching the layer of silicon, doping the layer of silicon, and oxidizing the remaining portions of the layer of silicon. The annealing of the layer of silicon can be performed during the gate oxidation or during other subsequent high temperature steps so that a dedicated or specific gate anneal is not required. As an example, a first portion of the gate electrodes of step 350 can be similar to gate electrode 131 (FIG. 1) in P-MOS transistor 130 (FIG. 1), and a second portion of the gate electrodes of step 350 can be similar to gate electrode 121 (FIG. 1) in N-MOS transistor 120 (FIG. 1).

At a step 360, N-type source and drain regions are formed in the epitaxial layer of the semiconductor substrate. The source and drain regions can be formed by implantation and/or diffusion processes. As an example, the N-type source and drain regions of step 360 can be similar to N-type source and drain regions 122 (FIG. 1) in N-MOS transistor 120 (FIG. 1). Furthermore, region 221 (FIG. 2) in HBT 210 (FIG. 2) can also be formed simultaneously with N-type source and drain regions 122 (FIG. 1) during step 360.

Next, at a step 370, an HBT module is performed. At the beginning of the HBT module, at least one protective layer is formed over the MOS transistors and other non-HBT portions of the BiCMOS IC before the portions of the HBT are doped, deposited, grown, and/or etched. The protective layer or layers are used to protect the non-HBT portions of the BiCMOS IC during formation of the portions of the HBT. The protective layer or layers are removed at the end of the HBT module.

Although portions of the HBT may be formed prior to step 370, the HBT module of step 370 is designed to be largely independent of the CMOS processing that occurs before the HBT module. The details of this HBT module are described hereinafter.

Figure 4:
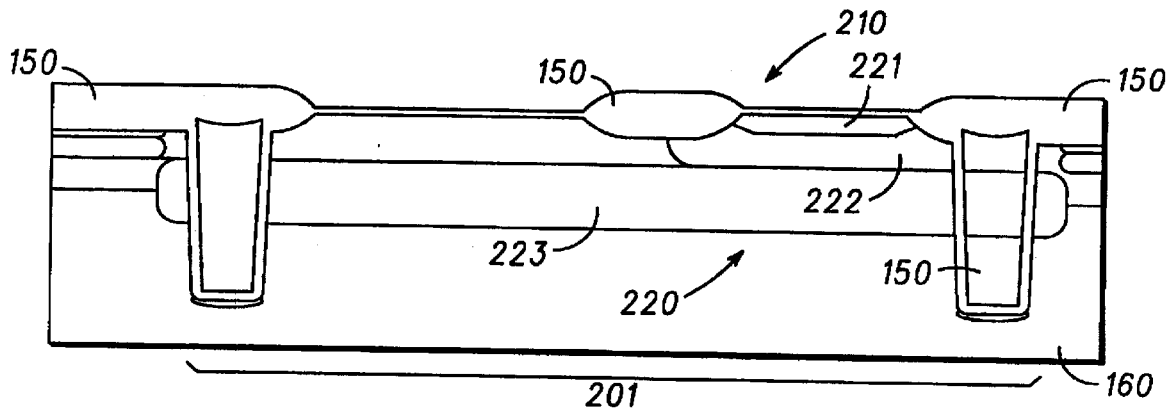
FIG. 4 illustrates a cross-sectional view of the HBT portion of the heterojunction BiCMOS IC before performing an HBT module in the method of FIG. 3 in accordance with an embodiment of the invention.
Figure 5:
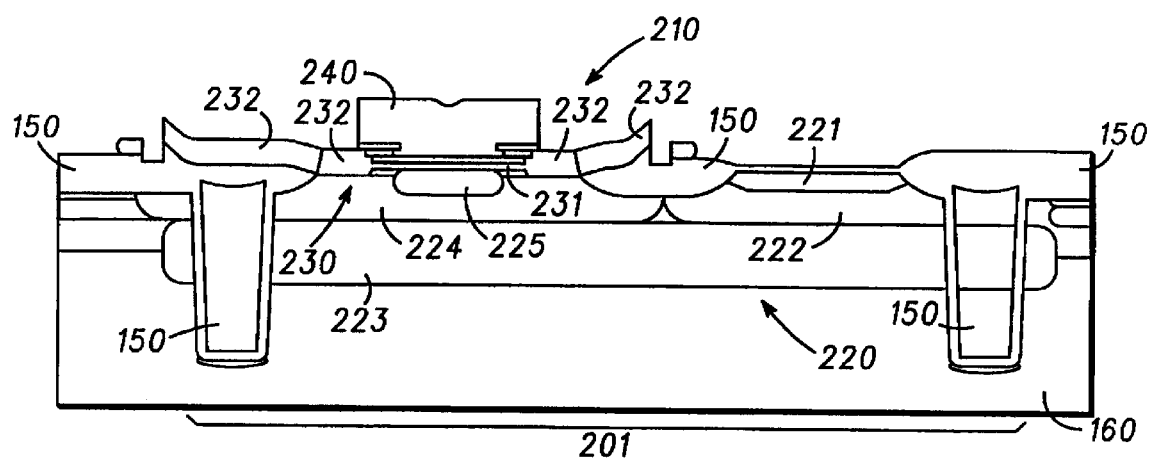
FIG. 5 illustrates a cross-sectional view of the HBT portion of the heterojunction BiCMOS IC after performing the HBT module in the method of FIG. 3 in accordance with an embodiment of the invention.
Figure 6:
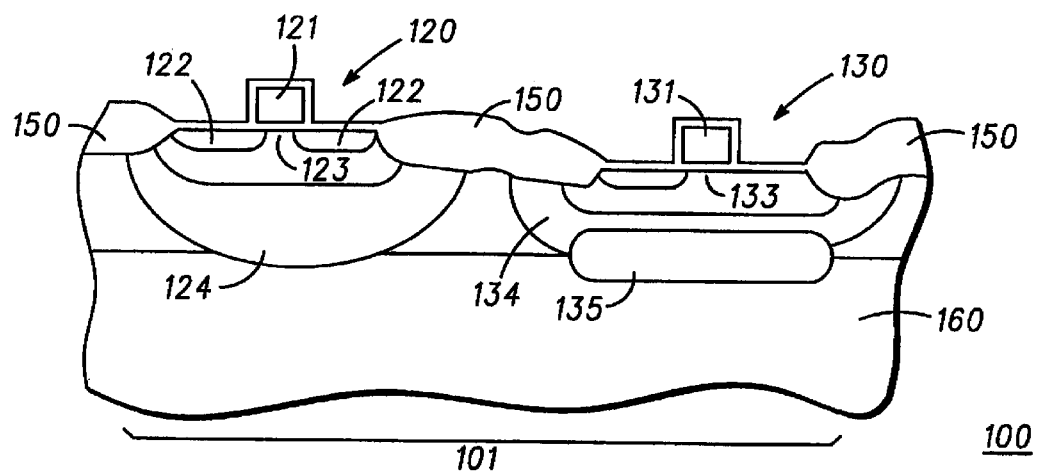
FIG. 6 illustrates a cross-sectional view of the CMOS portion of the heterojunction BiCMOS IC before performing the HBT module in the method of FIG. 3 in accordance with an embodiment of the invention.
Figure 7:
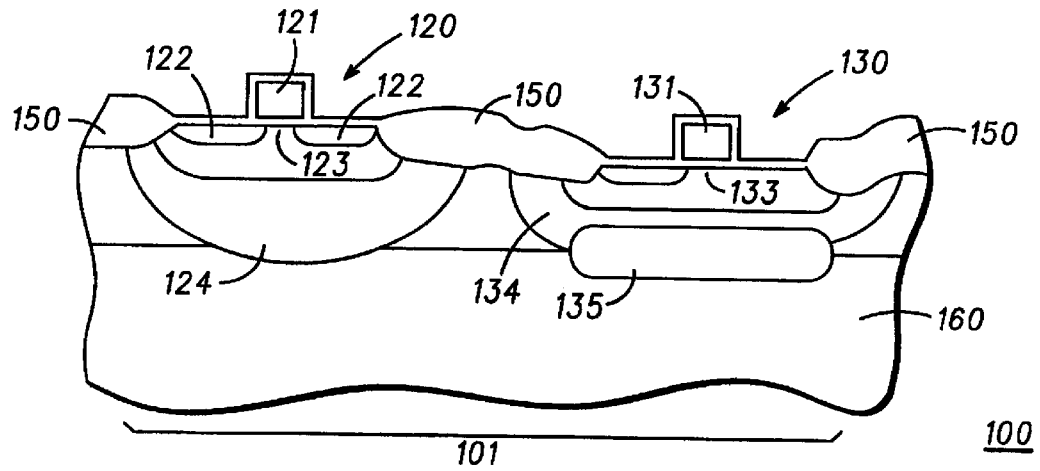
FIG. 7 illustrates a cross-sectional view of the CMOS portion of the heterojunction BiCMOS IC after performing the HBT module in the method of FIG. 3 in accordance with an embodiment of the invention.

FIG. 4 illustrates a cross-sectional view of HBT portion 201 of heterojunction BiCMOS IC 100 before performing the HBT module of step 370 in FIG. 3, and FIG. 5 illustrates a cross-sectional view of HBT portion 201 of heterojunction BiCMOS IC 100 after performing the HBT module of step 370 in FIG. 3. FIG. 6 illustrates a cross-sectional view of CMOS portion 101 of heterojunction BiCMOS IC 100 before performing the HBT module of step 370 in FIG. 3, and FIG. 7 illustrates a cross-sectional view of CMOS portion 101 of heterojunction BiCMOS IC 100 after performing the HBT module of step 370 in FIG. 3. By comparing FIGS. 6 and 7, one skilled in the art will understand that the condition or configuration of CMOS portion 101 is the same immediately before and immediate after the HBT module. Accordingly, the HBT module of step 370 is modular and is compatible with a wide range of CMOS manufacturing processes.

Returning to FIG. 3, at a step 380 in flow chart 300, P-type source and drain regions are formed in the epitaxial layer of the semiconductor substrate after performing the HBT module of step 370. The source and drain regions of step 380 can be formed by implantation and/or diffusion processes. As an example, the P-type source and drain regions of step 380 can be similar to P-type source and drain regions 132 (FIG. 1) in P-MOS transistor 130 (FIG. 1).

In the embodiment of the manufacturing method illustrated in FIG. 3, the N-type source and drain regions are formed before performing the HBT module and before forming the P-type source and drain regions, and the P-type source and drain regions are formed after performing the HBT module and after forming the N-type source and drain regions. In another embodiment of the manufacturing method, the N-type and P-type source and drain regions can both be formed after performing the HBT module, and in a further embodiment of the manufacturing method, the N-type and P-type source and drain regions can both be formed before performing the HBT module. Additionally, the sequence of forming the N-type and P-type source and drain regions can be reversed in any of the embodiments described herein. The specific sequence of steps for forming the N-type and P-type source and drain regions is dependent upon the diffusion lengths of the particular dopants used and the time and temperature of the processing steps occurring after forming N-type and P-type source and drain regions.

Then, at a step 390 of flow chart 300 in FIG. 3, a multi-level interconnect structure is formed over and is electrically coupled to the N-MOS transistors, the P-MOS transistors, and the HBTs. Step 390 can include planarization techniques, and the multi-level interconnect structure can include metal layers comprised of gold, copper, aluminum and/or tungsten. The multi-level interconnect structure can further include tungsten via plugs and diffusion barrier layers comprised of titanium and/or tungsten. As an example, the multi-level interconnect structure of step 390 can be similar to multi-level interconnect structure 140

(FIGS. 1 and 2). A self-aligned silicide (salicide) process, among other processes, will be formed between steps 380 and 390.

Figure 8:
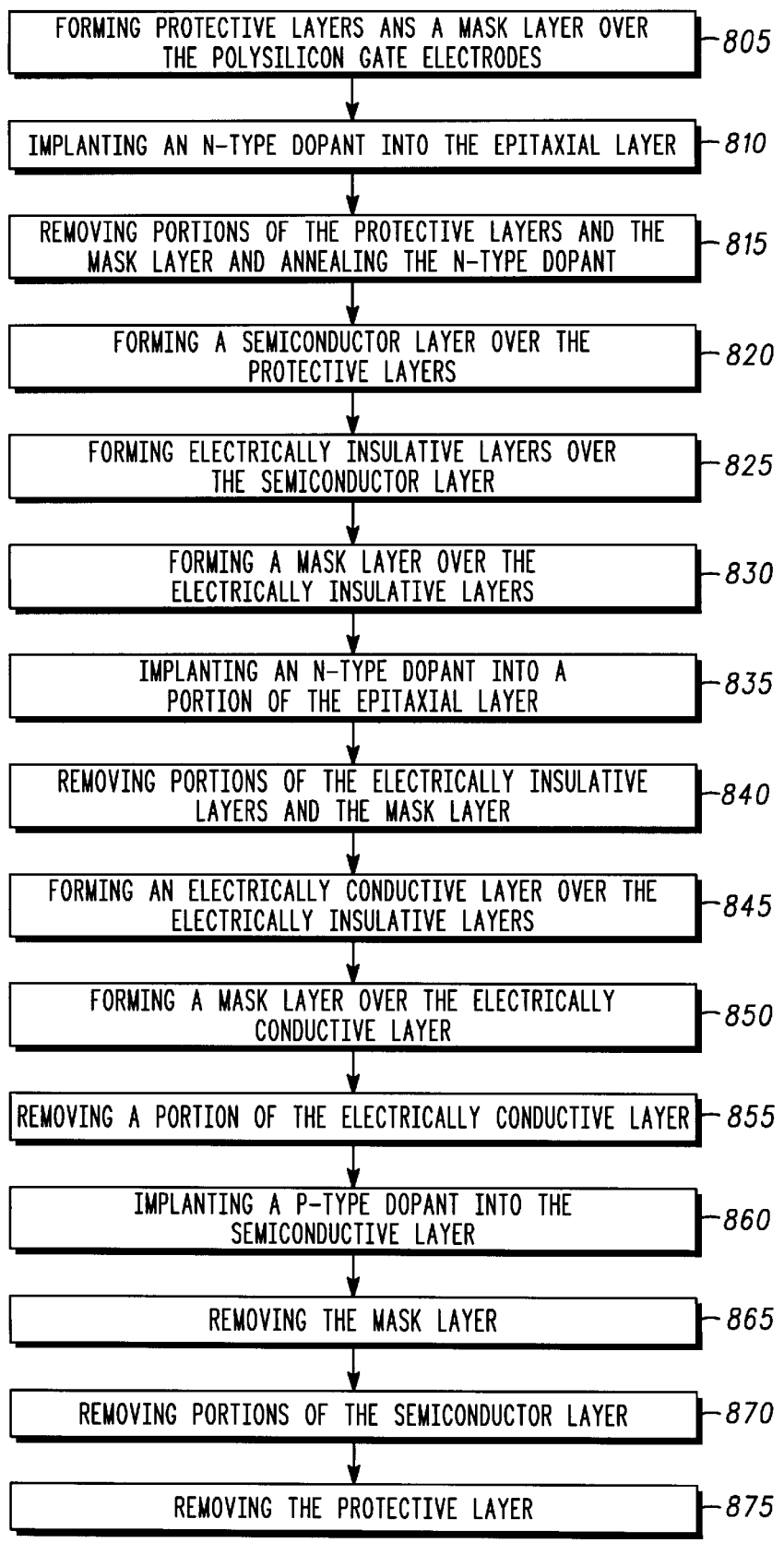
FIG. 8 illustrates a flow chart of the HBT module in the method of FIG. 3 in accordance with an embodiment of the invention.

FIG. 8 illustrates a flow chart of the HBT module of step 370 in FIG. 3, and FIGS. 9 through 15 illustrate cross-sectional views of HBT portion 201 in heterojunction BiCMOS IC 100 during various steps of the HBT module in FIG. 8. As indicated earlier, during the HBT module of FIG. 8, at least one protective layer is formed over the gate electrodes and the semiconductor substrate where the protective layer has a hole exposing a portion of the semiconductor substrate. As explained earlier, the protective layer or layers are used to protect the CMOS portions and other non-HBT portions of the BiCMOS IC during formation of various portions of the HBT.

For example, at a step 805 of FIG. 8, protective layers are deposited over the polysilicon gate electrodes and the epitaxial layer of the semiconductor substrate. In the preferred embodiment, two or three protective layers are deposited. If two protective layers are deposited, a 10 to 200 nanometer (nm) layer comprised of tetra-ethyl-ortho-silicate (TEOS) or another oxide can be deposited first, and a 10 to 200 nm layer comprised of silicon nitride (SiN) or amorphous silicon (a-Si) can be deposited over the layer comprised of TEOS. In the two protective layer embodiment using SiN, the layer comprised of TEOS serves as a buffer layer between the overlying layer comprised of SiN and the underlying gate oxidation layer, and the layer comprised of SiN serves as a hydrogen diffusion barrier during a subsequent epitaxial growth process. The layer comprised of SiN also serves as an etch stop to protect the CMOS and other non-HBT portions underlying the layer comprised of SIN. In the two protective layer embodiment using a-Si, the layer comprised of a-Si serve as a hard mask, and the layer comprised of TEOS serves as an etch stop.

If three protective layers are deposited, a 10 to 50 nm layer comprised of silicon-rich nitride (SiRN) can be deposited first; a 10 to 50 nm layer comprised of TEOS or another oxide can be deposited over the layer comprised of SiRN or SiN; and a 10 to 50 nm layer comprised of a-Si can be deposited over the layer comprised of TEOS. One skilled in the art will understand that other combinations of protective layers such as can also be used.

Figure 9:
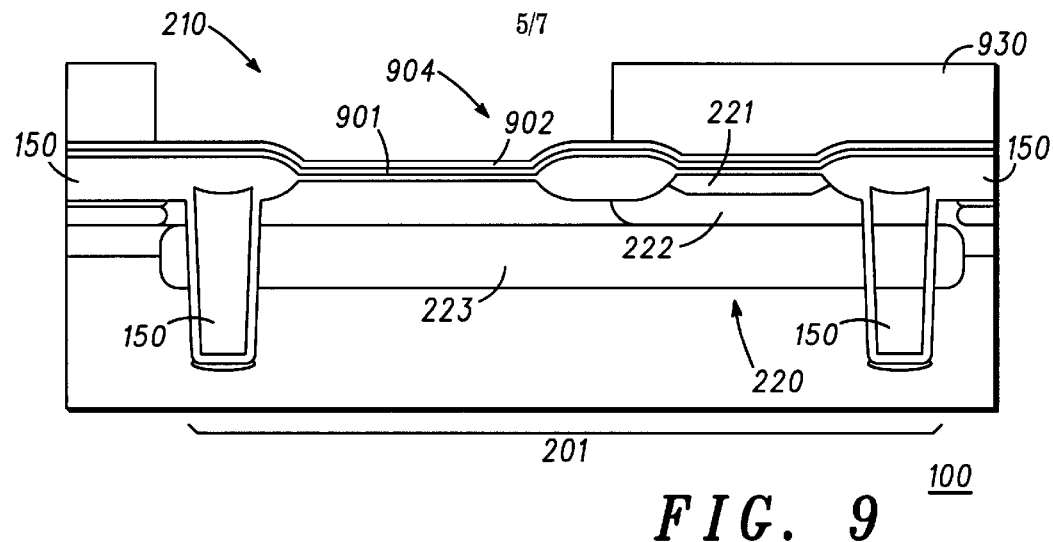
FIGS. 9 through 15 illustrate cross-sectional views of the HBT portion of the heterojunction BiCMOS IC during various steps of the HBT module of FIG. 8 in accordance with an embodiment of the invention.

Also in step 805, a mask layer having holes can be formed over the protective layers. The holes in the mask layer expose portions of the underlying protective layers. In the preferred embodiment, the mask layer is comprised of photoresist. FIG. 9 illustrates a cross-sectional view of HBT portion 201 after step 805 (FIG. 8). HBT portion 201 in FIG. 9 includes a TEOS layer 901, a SiN layer 902, and a mask layer 903 having a hole 904 formed during step 805 (FIG. 8).

Returning to FIG. 8, at a step 810, an N-type dopant is implanted through the holes in the mask layer, through the portions of the protective layers exposed by the holes in the mask layer, and into the portions of the epitaxial layer underlying the holes in the mask layer. The N-type dopant forms N-type regions in these portions of the epitaxial layer where the N-type regions are part of the collector regions in the HBTs of the IC. As an example, phosphorous can be used for the N-type dopant.

Subsequently, at a step 815 of FIG. 8, portions of the protective layers are removed to form holes in the protective layers and to expose the underlying portions of the epitaxial layer. Each of the removed portions of the protective layers are located over at least one of the buried collector regions. The mask layer also previously defined the N-type regions in the epitaxial layer. Therefore, the removed portions of the protective layers are self-aligned to the N-type regions in the epitaxial layer.

Figure 10:
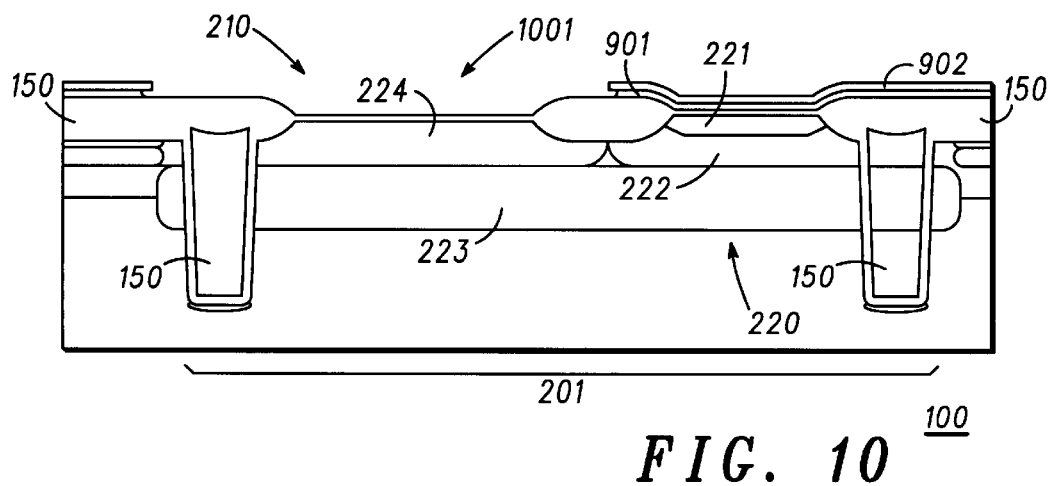

Also in step 815, the N-type regions formed during step 810 and the N-type source and drain regions formed during step 360 (FIG. 3) are annealed. In the embodiment where two protective layers are used, a reactive ion etching process is preferably used to etch the holes in the top protective layer, as defined by the holes in the mask layer, to expose the underlying portions of the bottom protective layer. Then, the mask layer is removed, and the N-type regions and the N-type source and drain regions are annealed. Subsequently, a dilute hydrofluoric acid is preferably used to etch the holes in the bottom protective layer, as defined by the holes in the top protective layer, to expose the underlying portions of the epitaxial layer. Therefore, the mask layer directly defines the holes in the top protective layer and indirectly defines the holes in the bottom protective layer. FIG. 10 illustrates a cross-sectional view of HBT portion 201 after step 815 (FIG. 8). HBT portion 201 in FIG. 10 includes region 224 formed during step 810 (FIG. 8) and also includes a hole 1001 in layers 901 and 902 formed during step 815 (FIG. 8).

Returning to FIG. 8, after steps 805, 810, and 815, at a step 820, a semiconductor layer is formed over the protective layers and the epitaxial layer. The semiconductor layer is comprised of a different semiconductor material than the epitaxial layer. In the preferred embodiment, the semiconductor layer has a thickness of approximately 50 to 200 nm and is comprised of silicon germanium carbon. The semiconductor layer can have approximately 0.0 to 1.0 percent carbon by weight, but preferably has approximately 0.2 percent carbon by weight. The use of silicon germanium carbon in the semiconductor layer reduces the spreading of the base profile caused by a subsequent selectively implanted collector (SIC) region. Also in the preferred embodiment, the portions of the semiconductor layer located directly over the previously exposed portions of the epitaxial layer have a crystalline or epitaxial atomic structure, and the portions of the semiconductor layer that are not located directly over the previously exposed portions of the epitaxial layer have either a polycrystalline or amorphous atomic structure.

In a different embodiment, the epitaxial growth process of step 820 can be used to anneal the N-type regions formed during step 810 and the N-type source and drain regions formed during step 360 (FIG. 3). For example, a high temperature hydrogen pre-growth or bake portion of the epitaxial growth process can be used as the anneal. In this embodiment, the separate anneal process of step 815 can be eliminated.

Next, at a step 825 of FIG. 8, at least one electrically insulative layer is formed over the semiconductor layer. For example, a 10 to 100 nm layer comprised of TEOS or another oxide is deposited over the semiconductor layer, and then a 10 to 100 nm layer comprised of a-Si can deposited over the layer comprised of TEOS. The layer comprised of a-Si serves as a hard mask over the layer comprised of TEOS and protects the layer comprised of TEOS from being thinned during a subsequent pre-emitter cleaning process. In the preferred embodiment, two electrically insulative layers are used.

Figure 11:
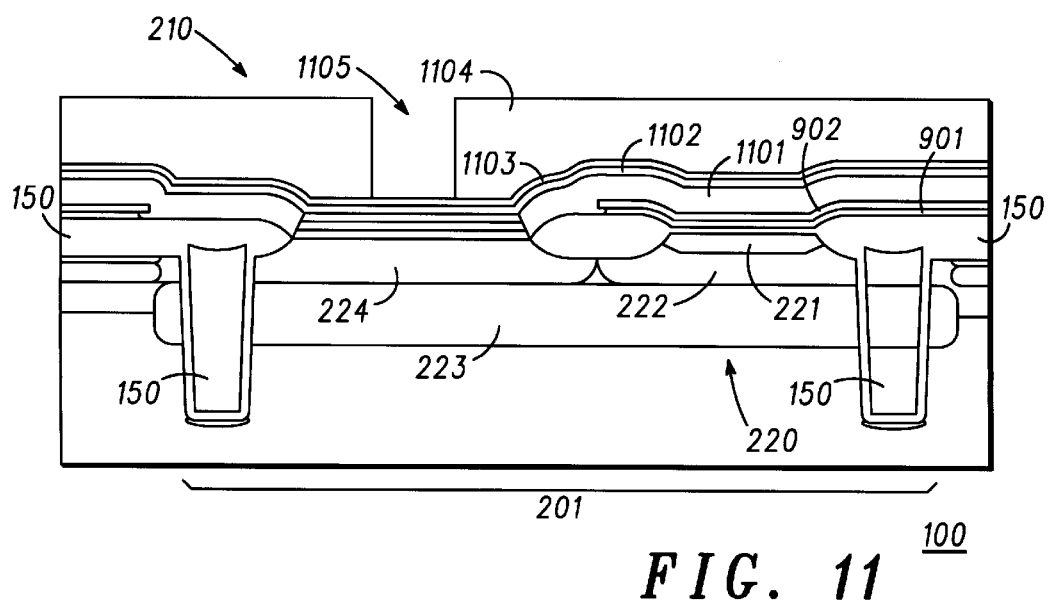

Then, at a step 830 of FIG. 8, a mask layer is formed over the electrically insulative layers where the mask layer has holes exposing underlying portions of the electrically insulative layers. These underlying portions of the electrically insulative layers are located over the holes in the protective layers formed in step 815 and are also located over the N-type regions formed in step 810. In the preferred embodiment, the mask layer is comprised of photoresist. FIG. 11 illustrates a cross-sectional view of HBT portion 201 after step 830 (FIG. 8). HBT portion 201 in FIG. 11 includes a semiconductor layer 1101 formed during step 820 (FIG. 8), a TEOS layer 1102 and an a-Si layer 1103 formed during step 825 (FIG. 8), and a mask layer 1104 having a hole 1105 formed during step 830 (FIG. 8).

Returning to FIG. 8, at a step 835 of FIG. 8, an N-type dopant is implanted through the holes in the mask layer, through portions of the electrically insulative layers exposed by the holes in the mask layer, and through the underlying portions of the semiconductor layer to form N-type regions in the underlying portions of the epitaxial layer. These N-type regions are portions of collector regions for HBTs in the heterojunction BiCMOS IC and are also referred to as selectively implanted collector (SIC) regions. In the preferred embodiment, these N-type regions are located in and are more heavily doped than the N-type regions formed previously during step 810. As an example, phosphorous can be used as the N-type dopant.

Subsequently, at a step 840 of FIG. 8, portions of the electrically insulative layers are removed to form holes in the electrically insulative layers where the holes expose underlying portions of the semiconductor layer. The mask layer formed during step 830 defines the removed portions or holes in the electrically insulative layers. This mask layer was also used previously to define the N-type regions during step 835. Accordingly, the holes in the electrically insulative layers are self-aligned to these previously formed N-type regions. One skilled in the art will understand that the sequence of the implantation in step 835 and the removal of the portions of the electrically insulative layer in step 840 can be reversed.

Figure 12:
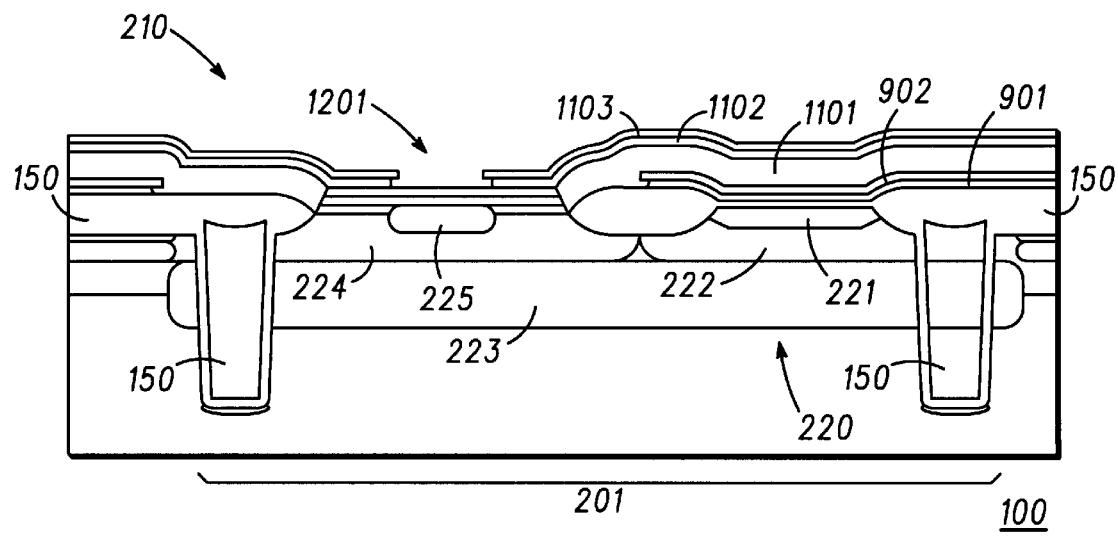

Also in step 840, the mask layer formed previously during step 830 is removed. In the preferred embodiment where two electrically insulative layers are used, the top electrically insulative layer is etched, as defined by the mask layer, to expose underlying portions of the bottom electrically insulative layer. Then, the mask layer is removed. Next, the bottom electrically insulative layer is etched, as defined by the holes in the top electrically insulative layer, to expose underlying portions of the semiconductor layer. Therefore, the mask layer directly defines the holes in the top electrically insulative layer and indirectly defines the holes in the bottom electrically insulative layer. FIG. 12 illustrates a cross-sectional view of HBT portion 201 after step 840 (FIG. 8). HBT portion 201 in FIG. 12 includes region 225 formed during step 835 (FIG. 8) and a hole 1201 in layers 1102 and 1103 formed during step 840 (FIG. 8).

Returning to FIG. 8, at a step 845, an electrically conductive layer is formed over the semiconductor layer and the holes in the electrically insulative layers. In the preferred embodiment, the electrically conductive layer has a thickness of approximately 100 to 300 nm and is comprised of N-type silicon that can be doped during deposition (in-situ) or after deposition. As an example, arsenic (As) can be used to dope the silicon in the electrically conductive layer. Portions of the electrically conductive layer that are located directly over the previously exposed semiconductor layer preferably have an epitaxial or crystalline atomic structure, and portions of the electrically conductive layer that are located directly over the electrically insulative layers preferably have a polycrystalline or amorphous atomic structure.

Figure 13:
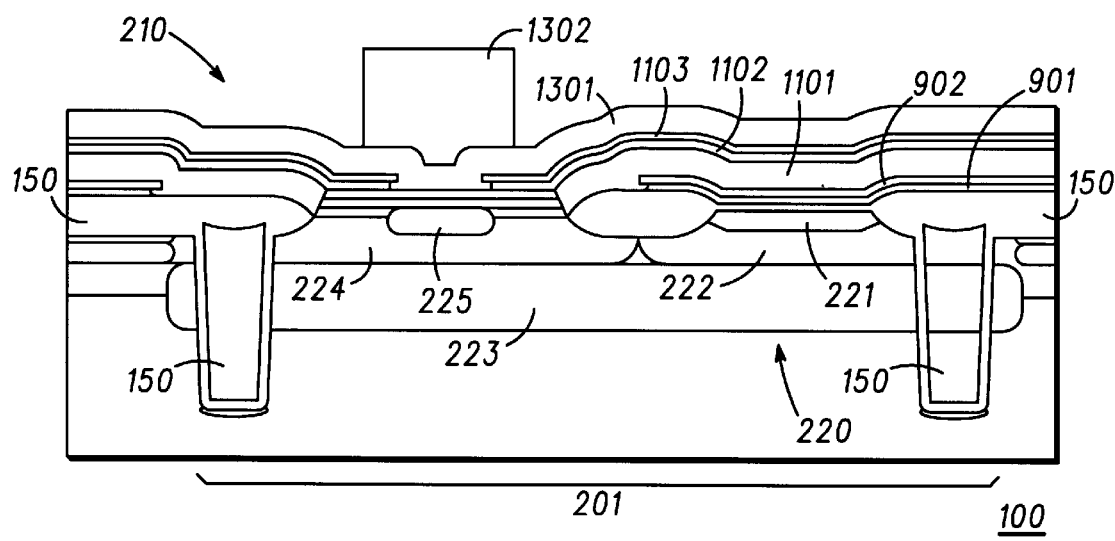

Subsequently, during steps 850 and 855, an emitter region is formed in the electrically conductive layer. In step 850, a mask layer is formed over portions of the electrically conductive layer that are located in the holes of the electrically insulative layers. In the preferred embodiment, the mask layer is comprised of photoresist. FIG. 13 illustrates a cross-sectional view of HBT portion 201 after step 850 (FIG. 8). HBT portion 201 in FIG. 13 includes an electrically conductive layer 1301 formed during step 845 (FIG. 8) and a mask layer 1302 formed during step 850 (FIG. 8). Returning to FIG. 8, at step 855, the exposed portions of the electrically conductive layer are removed or etched to expose underlying portions of the electrically insulative layers. The mask layer protects the portions of the electrically conductive layer underlying the mask layer from the etchant, and these portions of the electrically conductive layer are used as emitter regions for the HBTs in the heterojunction BiCMOS IC. In the preferred embodiment, a reactive ion etchant is used to pattern the electrically conductive layer.

Next, at a step 860 of FIG. 8, a P-type dopant is implanted through the exposed portions of the electrically insulative layers and into underlying portions the semiconductor layer. As an example, boron or boron fluoride can be used as the P-type dopant. The mask layer formed previously during step 850 blocks the P-type dopant from the remaining portions of the electrically conductive layer that underlie the mask layer. Accordingly, the mask layer also blocks the P-type implant from the portions of the semiconductor layer that underlie the remaining portions of the electrically conductive layer. The portions of the semiconductor layer that are not implanted during step 860 form intrinsic base regions for the HBTs, and the portions of the semiconductor layer that are implanted during step 860 form extrinsic base regions for the HBTs.

Figure 14:
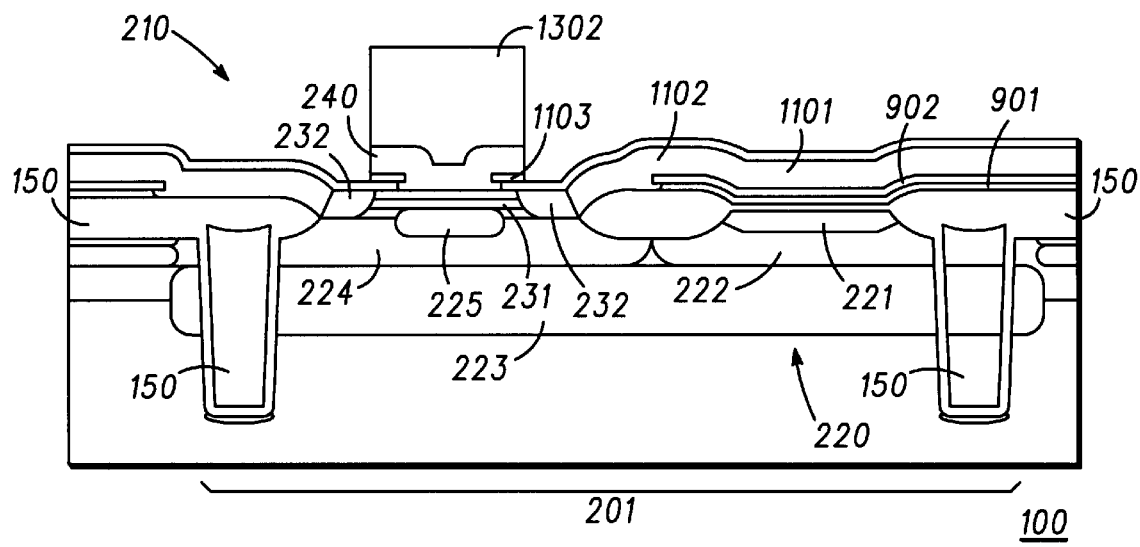

The mask layer formed previously during step 850 is used to define the emitter regions during step 855 and is also used to define the transition point between the intrinsic and extrinsic base regions during step 860. Therefore, the outer portions of the intrinsic base regions and the inner portions of the extrinsic base regions are self-aligned to the emitter regions. FIG. 14 illustrates a cross-sectional view of HBT portion 201 after step 860 (FIG. 8). HBT portion 201 in FIG. 14 includes emitter region 240 formed during step 855 (FIG. 8) and intrinsic base region 231 and extrinsic base regions 232 formed during step 860 (FIG. 8). One skilled in the art will understand that portions of the electrically insulative layers or layers 1102 and 1103 may be removed during the patterning or formation of emitter region 240.

Returning to FIG. 8, at a step 865, the mask layer formed previously during step 850 is removed. Then, an optional 10 to 60 nm layer comprised of TEOS or another oxide can be deposited. This optional layer can be used to protect the emitter regions and the extrinsic base regions from the etchants used during the subsequent removal of the protective layers that were formed previously during step 805.

Figure 15:
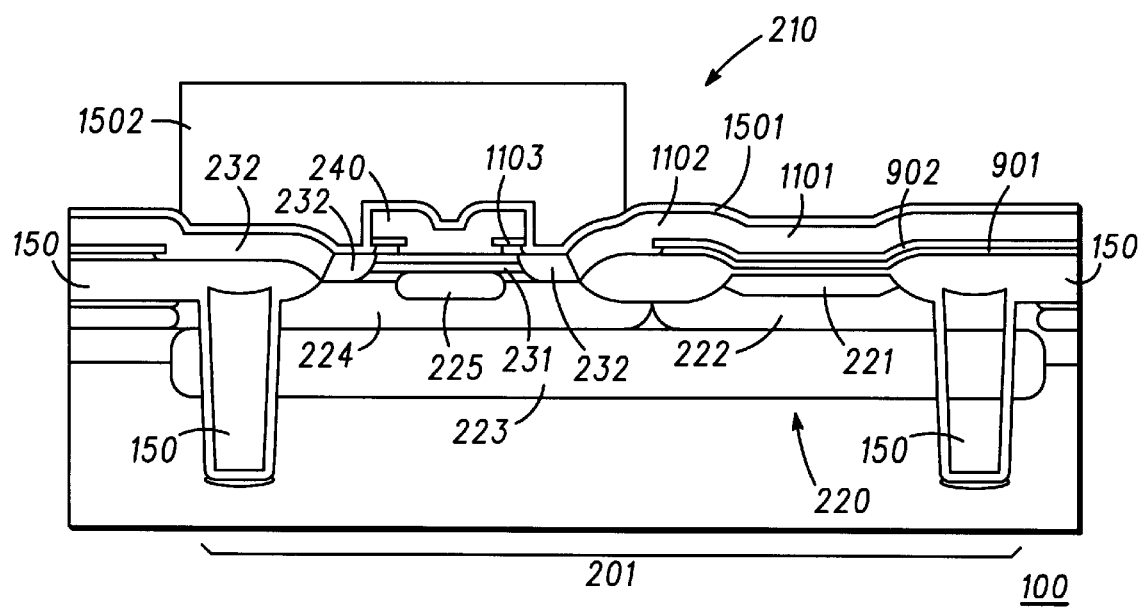

Subsequently, during a step 870 of FIG. 8, portions of the semiconductor layer are removed or etched, preferably by using a reactive ion etch. In the preferred embodiment, a mask layer is formed to cover the emitter regions, the intrinsic base regions, and portions of the extrinsic base regions that are adjacent to the intrinsic base regions. In the preferred embodiment, the mask layer is comprised of photoresist. FIG. 15 illustrates a cross-sectional view of HBT portion 201 after step 870 (FIG. 8). HBT portion 201 in FIG. 15 includes TEOS layer 1501 and a mask layer 1502 formed during step 870 (FIG. 8). The exposed portions of the optional TEOS layer are also removed during the patterning of the semiconductor layer. This patterning step defines outer portions of the extrinsic base regions and does not affect the intrinsic base regions.

Then, at a step 875 of FIG. 8, the protective layers that were formed previously during step 805 are removed. In the two protective layer embodiment where the top layer is comprised of SiN, a hot phosphoric wet etchant is used to remove the layer comprised of SiN, and a dilute hydrofluoric acid etchant is used to remove the layer comprised of TEOS. FIG. 5, discussed previously, illustrates a cross-sectional view of HBT portion 201 after step 875 (FIG. 8).

Therefore, an improved method of manufacturing a heterojunction BiCMOS IC is provided to overcome the disadvantages of the prior art. The manufacturing steps specific to the HBTs in the heterojunction BiCMOS IC are modular and are compatible with, or at least adaptable to, a wide range of conventional CMOS manufacturing processes. The HBTs can be manufactured using conventional processing equipment, and the electrical performance of the HBTs is superior to that of homojunction bipolar transistors.

Although the invention has been described with reference to specific embodiments, it will be understood by those skilled in the art that various changes may be made without departing from the spirit or scope of the invention. For instance, the numerous details set forth herein such as, for example, the specific conductivity types, the chemical compositions, and the atomic structures are provided to facilitate the understanding of the invention and are not provided to limit the scope of the invention. As additional examples, step 810 in FIG. 8 can be performed before step 805 in FIG. 8, or step 810 in FIG. 8 can be performed during step 815 between removing the portions of the protective layers and removing the mask layer. As further examples, double polysilicon capacitors can be formed between steps 320 and 330 in FIG. 3, and graded channels in the MOS transistors can be formed between steps 350 and 360 in FIG. 3. Moreover, the method described herein can be used to manufacture bipolar ICs that do not contain any MOS transistors. In this bipolar IC embodiment, the protective layers of step 805 in FIG. 8 can be used to protect passive devices such as resistors and capacitors. Accordingly, the disclosure of embodiments of the invention is intended to be illustrative of the scope of the invention and is not intended to be limiting. It is intended that the scope of the invention shall be limited only to the extent required by the appended claims.

What is claimed is:

1. A method of manufacturing a heterojunction BiCMOS integrated circuit comprising:
    forming a gate electrode over a semiconductor substrate;
    forming a protective layer over the gate electrode and the semiconductor substrate, the protective layer having a hole, comprising the steps of;
        forming an insulating layer over the gate and the semiconductor substrate;
        forming an amorphous silicon layer over the insulating layer; and
        forming the hole in the protective layer;
    forming a semiconductor layer over the protective layer, the semiconductor layer comprised of a different semiconductor material than the semiconductor substrate;
    forming an electrically insulative layer over the semiconductor layer;
    doping a portion of a collector region in the semiconductor substrate;
    self-aligning a hole in the electrically insulative layer to the portion of the collector region;
    forming an electrically conductive layer over the semiconductor layer and the hole in the electrically insulative layer;
    defining an emitter region in the electrically conductive layer; and
    self-aligning an extrinsic base region in the semiconductor layer to the emitter region.

2. The method of claim 1 further comprising:
    forming a well having a first conductivity type in the semiconductor substrate;
    forming a well having a second conductivity type in the semiconductor substrate;
    forming source and drain regions having the first conductivity type in the semiconductor substrate; and
    forming source and drain regions having the second conductivity type in the semiconductor substrate.

3. The method of claim 2 wherein:
    forming the source and drain regions of the first conductivity type occurs before forming the protective layer.

4. The method of claim 3 wherein:
    forming the source and drain regions of the second conductivity type occurs after self-aligning the extrinsic base region.

5. The method of claim 2 wherein:
    forming the source and drain regions of the first conductivity type occurs after self-aligning the extrinsic base region.

6. The method of claim 5 wherein:
    forming the source and drain regions of the second conductivity type occurs after self-aligning the extrinsic base region.

7. The method of claim 1 further comprising:
    forming gates for CMOS transistors;
    forming sidewall spacers adjacent to the gates after forming the protective layer.

8. A method of manufacturing an integrated circuit comprising:
    forming a protective layer over a semiconductor substrate, the protective layer having a hole exposing a portion of the semiconductor substrate, comprising the steps of;
        forming an insulating layer over the gate and the semiconductor substrate;
        forming an amorphous silicon layer over the insulating layer; and
        forming the hole in the protective layer;
    forming a semiconductor layer over the portion of the semiconductor substrate and over the protective layer;
    depositing an electrically insulative layer over the semiconductor layer;
    using a first mask layer to define a doped region in the portion of the semiconductor substrate and to define a hole in the electrically insulative layer, the doped region for a portion of a collector region in a bipolar transistor;
    forming an electrically conductive layer over the semiconductor layer and the hole in the electrically insulative layer;
    using a second mask layer to define an emitter region in the electrically conductive layer and to define an intrinsic base region and a first portion of an extrinsic base region in the semiconductor layer, the emitter region, the intrinsic base region, and the extrinsic base region for the bipolar transistor; and
    using a third mask layer to define a second portion of the extrinsic base region in the semiconductor layer.

9. The method of claim 8 further comprising:

forming gate electrodes over the semiconductor substrate, the gate electrodes for MOS transistors;

forming a doped layer beneath a surface of the semiconductor substrate;

forming an electrically insulative region in the semiconductor substrate;

forming an N-type well in the semiconductor substrate;

forming a P-type well in the semiconductor substrate;

forming N-type source and drain regions in the semiconductor substrate;

forming P-type source and drain regions in the semiconductor substrate; and forming a multi-level interconnect structure located over and electrically coupled to the extrinsic base region, the emitter region, and the gate electrodes.

10. The method of claim 9 wherein:

forming the N-type source and drain regions occurs before forming the protective layer.

11. The method of claim 10 wherein:

forming the P-type source and drain regions occurs after using the third mask layer.

12. The method of claim 9 wherein:

forming the N-type source and drain regions occurs after using the third mask layer.

13. The method of claim 12 wherein:

forming the P-type source and drain regions occurs after using the third mask layer.

14. The method of claim 9 wherein:

forming the N-type well further comprises simultaneously forming an other N-type well in the semiconductor substrate, the other N-type well for another portion of the collector region; and forming the N-type source and drain regions further comprises simultaneously forming an N-type region in the semiconductor substrate as an additional portion of the collector region.

15. The method of claim 8 further comprising:

forming gates for CMOS transistors;

forming sidewall spacers adjacent the gates after forming the protective layer; and forming an other doped region in the semiconductor substrate before forming the semiconductor layer, the other doped region for another portion of the collector region, wherein:

using the first mask layer further comprises using the first mask layer to define the doped region in the other doped region.

16. The method of claim 15 further comprising:

annealing the other doped region before forming the semiconductor layer.

17. The method of claim 15 further comprising:

annealing the other doped region during forming the semiconductor layer.

18. A method of manufacturing a heterojunction BiCMOS integrated circuit comprising:

forming polysilicon gate electrodes over a semiconductor substrate having an epitaxial layer with doped buried layers, a first portion of the polysilicon gate electrodes for P-MOS transistors and a second portion of the polysilicon gate electrodes for N-MOS transistors;

depositing protective layers over the polysilicon gate electrodes and the semiconductor substrate, wherein the protective layers comprise an amorphous silicon layer over an insulating layer;

removing portions of the protective layers to expose portions of the epitaxial layer, each of the portions of the protective layers located over at least one of the doped buried layers;

growing a silicon germanium carbon layer over the portions of the epitaxial layer and over the protective layers, first portions of the silicon germanium carbon layer being epitaxial and located over the portions of the epitaxial layer and second portions of the silicon germanium carbon layer located over the protective layers;

depositing electrically insulative layers over the silicon germanium carbon layer;

forming a first mask layer over the electrically insulative layers, the first mask layer having holes exposing first portions of the electrically insulative layers, located over the first portions of the silicon germanium carbon layer, and located over the portions of the epitaxial layer;

implanting an N-type dopant through the holes in the first mask layer, through the first portions of the electrically insulative layers, and through the first portions of the silicon germanium carbon layer to form first N-type regions in the portions of the epitaxial layer, the first N-type regions for first portions of collector regions in NPN bipolar transistors;

etching holes in the electrically insulative layers, the first mask layer defining the holes in the first portions of the electrically insulative layers to expose first portions of the first portions of the silicon germanium carbon layer;

removing the first mask layer after implanting the N-type dopant and after etching the holes in the electrically insulative layers;

forming an N-type silicon layer over the epitaxial layer, the electrically insulative layers, and the silicon germanium carbon layer;

forming a second mask layer over first portions of the N-type silicon layer located over the first portions of the first portions of the silicon germanium carbon layer;

etching second portions of the N-type silicon layer to expose second portions of the electrically insulative layers, the second mask layer protecting the first portions of the N-type silicon layer to define emitter regions in the first portions of the N-type silicon layer, the emitter regions for the NPN bipolar transistors;

implanting a P-type dopant through the second portions of the electrically insulative layers and into second portions of the first portions of the silicon germanium carbon layer and into the second portions of the silicon germanium carbon layer, the second mask layer blocking the P-type dopant from the first portions of the N-type silicon layer and from the first portions of the first portions of the silicon germanium carbon layer, the first portions of the first portions of the silicon germanium carbon layer forming an intrinsic base region for the NPN bipolar transistors;

removing the second mask layer after etching the second portions of the N-type silicon layer and after implanting the P-type dopant; and etching to remove portions of the second portions of the silicon germanium carbon layer while keeping at least the first portions of the silicon germanium carbon layer to define extrinsic base regions in the second portions of the first portions of the silicon germanium carbon layer and in remaining portions of the second portions of the silicon germanium carbon layer, the extrinsic base regions for the NPN bipolar transistors; and forming sidewall spacers adjacent to the polysilicon gate electrodes after the step of etching to remove portions of the second portions of the silicon germanium carbon layer.

19. The method of claim 18 further comprising:

providing the semiconductor substrate to be comprised of the epitaxial layer having the doped buried layers and a support substrate located under the epitaxial layer, the support substrate and the epitaxial layer having a P-type conductivity and the doped buried layers having an N-type conductivity;

forming electrically insulative regions in the epitaxial layer;

implanting N-type wells in the epitaxial layer for the P-MOS transistors;

implanting P-type wells in the epitaxial layer for the N-MOS transistors;

implanting N-type source and drain regions in the epitaxial layer for the N-MOS transistors;

implanting P-type source and drain regions in the epitaxial layer for the P-MOS transistors; and forming a multi-level interconnect structure located over and electrically coupled to the N-MOS transistors, the P-MOS transistors, and the NPN bipolar transistors.

20. The method of claim 19 wherein:

implanting the N-type source and drain regions in the epitaxial layer occurs before forming the protective layers.

21. The method of claim 19 wherein:

implanting the N-type source and drain regions in the epitaxial layer occurs after etching to remove the portions of the second portions of the silicon germanium carbon layer.

22. The method of claim 19 wherein:

implanting the N-type wells further comprises simultaneously implanting a portion of the N-type wells in the epitaxial layer for second portions of the collector regions in the NPN bipolar transistors; and implanting the N-type source and drain regions further comprises simultaneously implanting second N-type regions in the epitaxial layer as third portions of the collector regions in the NPN bipolar transistors.

23. The method of claim 22 further comprising:

forming a third mask layer over the protective layers before removing the portions of the protective layers, the third mask layer having holes; and implanting the N-type dopant through holes in the third mask layer, through the protective layers, and into the epitaxial layer to form third N-type regions in the portions of the epitaxial layer before removing the portions of the protective layers, wherein:

implanting the N-type dopant through the holes in the first mask layer further comprises forming the first N-type regions in the third N-type regions.

24. The method of claim 23 further comprising:

annealing the third N-type regions before growing the silicon germanium carbon layer.

25. The method of claim 18 wherein:

growing the silicon germanium carbon layer further comprises providing the silicon germanium carbon layer to have approximately 0.2 percent carbon;

depositing the electrically insulative layers further comprises selecting the electrically insulative layers from the group consisting of amorphous silicon, and TEOS;

forming the first mask layer further comprises providing photoresist for the first mask layer; and forming the second mask layer further comprises providing photoresist for the second mask layer.

26. A method of manufacturing a heterojunction BiCMOS integrated circuit comprising:

forming polysilicon gate electrodes over a semiconductor substrate having an epitaxial layer with doped buried layers, a first portion of the polysilicon gate electrodes for P-MOS transistors and a second portion of the polysilicon gate electrodes for N-MOS transistors;

depositing a protective layer over the polysilicon gate electrodes and the semiconductor substrate, wherein the protective layer comprises an amorphous silicon layer over an insulating layer;

removing portions of the protective layers to expose portions of the epitaxial layer, each of the portions of the protective layers located over at least one of the doped buried layers; and forming a heterojunction transistor in one of the exposed portions of the epitaxial layer that was exposed by the step of removing portions.

27. The method of claim 26, further comprising:

forming sidewall spacers adjacent the gate electrodes after forming the protective layer.

28. The method of claim 27, wherein the insulating layer is silicon oxide.

* * * * *